(12) United States Patent
Yu et al.

(10) Patent No.: US 9,865,566 B1
(45) Date of Patent: Jan. 9, 2018

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chi-Yang Yu, Taoyuan County (TW); Kuan-Lin Ho, Hsinchu (TW); Chin-Liang Chen, Kaohsiung (TW); Yu-Min Liang, Zhongli (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/183,131

(22) Filed: Jun. 15, 2016

(51) Int. Cl.
| | |
|---|---|
| *H01L 23/48* | (2006.01) |
| *H01L 25/065* | (2006.01) |
| *H01L 23/498* | (2006.01) |
| *H01L 23/367* | (2006.01) |
| *H01L 23/31* | (2006.01) |
| *H01L 25/00* | (2006.01) |
| *H01L 21/48* | (2006.01) |
| *H01L 21/54* | (2006.01) |

(52) U.S. Cl.
CPC ...... *H01L 25/0655* (2013.01); *H01L 21/4846* (2013.01); *H01L 21/4853* (2013.01); *H01L 21/4882* (2013.01); *H01L 21/54* (2013.01); *H01L 23/3142* (2013.01); *H01L 23/3178* (2013.01); *H01L 23/367* (2013.01); *H01L 23/498* (2013.01); *H01L 23/49811* (2013.01); *H01L 25/50* (2013.01)

(58) Field of Classification Search
USPC .......................................................... 257/737
See application file for complete search history.

(56) References Cited

U.S. PATENT DOCUMENTS

| | | | |
|---|---|---|---|
| 6,972,964 B2 * | 12/2005 | Ho | H01L 23/5389 257/E23.178 |
| 7,838,424 B2 | 11/2010 | Karta et al. | |
| 7,863,742 B2 | 1/2011 | Yu et al. | |
| 7,932,601 B2 | 4/2011 | Chang et al. | |
| 8,754,508 B2 | 6/2014 | Chen et al. | |
| 8,772,151 B2 | 7/2014 | Chen | |
| 8,846,548 B2 | 9/2014 | Tu et al. | |
| 2013/0341800 A1 | 12/2013 | Tu et al. | |
| 2014/0015122 A1 | 1/2014 | Chou et al. | |

(Continued)

*Primary Examiner* — Timor Karimy
(74) *Attorney, Agent, or Firm* — WPAT, P.C., Intellectual Property Attorneys; Anthony King

(57) ABSTRACT

A semiconductor structure includes a substrate, a redistribution layer (RDL) including a dielectric layer disposed over the substrate and a plurality of conductive members surrounded by the dielectric layer, a first conductive pillar disposed over and electrically connected with one of the plurality of conductive members, a second conductive pillar disposed over and electrically connected with one of the plurality of conductive member, a first die disposed over the RDL and electrically connected with the first conductive pillar, and a second die disposed over the RDL and electrically connected with the second conductive pillar, wherein a height of the second conductive pillar is substantially greater than a height of the first conductive pillar, and a thickness of the first die is substantially greater than a thickness of the second die.

20 Claims, 15 Drawing Sheets

(56) References Cited

U.S. PATENT DOCUMENTS

| | | |
|---|---|---|
| 2014/0045379 A1 | 2/2014 | Chen |
| 2014/0048926 A1 | 2/2014 | Wang et al. |
| 2014/0077356 A1 | 3/2014 | Chen et al. |
| 2014/0183693 A1 | 7/2014 | Tsai et al. |
| 2014/0187103 A1 | 7/2014 | Chen et al. |
| 2014/0252558 A1 | 9/2014 | Yu et al. |
| 2014/0252597 A1 | 9/2014 | Tsai et al. |
| 2014/0252601 A1 | 9/2014 | Lu et al. |
| 2014/0252608 A1 | 9/2014 | Chen et al. |
| 2014/0262468 A1 | 9/2014 | Chen et al. |
| 2014/0264885 A1 | 9/2014 | Tsai et al. |
| 2017/0092617 A1* | 3/2017 | Wu .................... H01L 25/0652 |

* cited by examiner

SEMICONDUCTOR STRUCTURE AND MANUFACTURING METHOD THEREOF

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, development of cracks, delamination of components or other issues, resulting in a high yield loss of the semiconductor device. The semiconductor device is produced in an undesired configuration, which would further exacerbate materials wastage and thus increase the manufacturing cost.

The semiconductor device is assembled with numbers of integrated components. Since more different components are involved, a complexity of the manufacturing operations of the semiconductor device is increased. There are more challenges to modify a structure of the semiconductor device and improve the manufacturing operations. As such, there is a continuous need to improve the manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
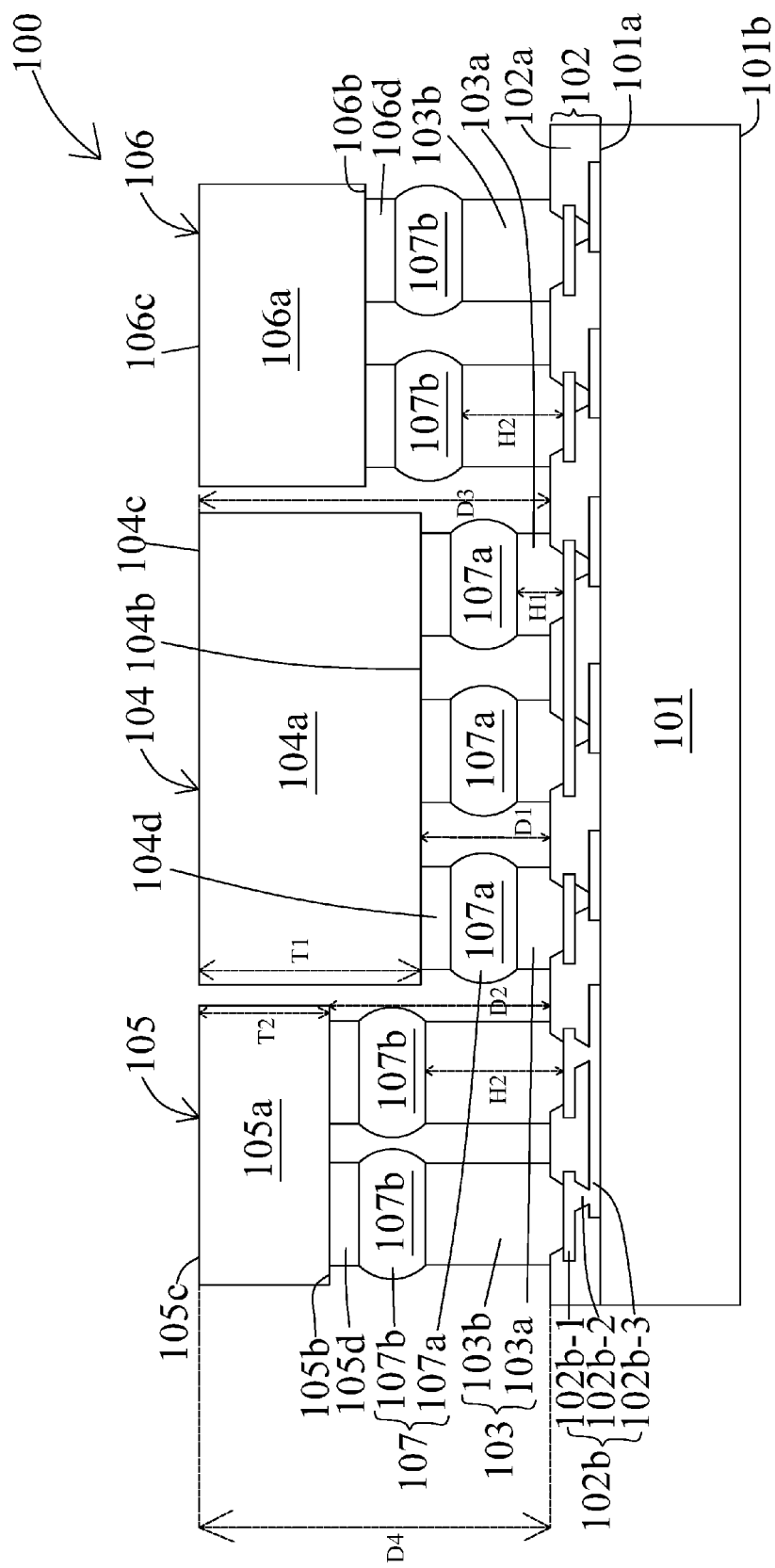
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. During the manufacturing, several dies are disposed over and electrically connected with a substrate to form a package. The dies are bonded over the substrate by several connectors such as bumps, solder joints, etc. However, since coefficient of thermal expansion (CTE) of the substrate and the dies are different from each other, the substrate and the dies would be expanded in different degrees during reflow of the connectors, and resulting in warpage of the package and poor electrical connection between the dies and the substrate (for example, cold joint issue that some of the connectors fail to attach the dies to the substrate and displace away from the substrate).

Furthermore, the dies are encapsulated by molding compound after the reflow. Since the dies may have different thickness from each other, some of backsides of the dies with smaller thickness are covered by the molding compound while some of backsides of the dies with greater thickness are exposed from the molding compound. The thickness difference of the dies would also result in warpage of the package and the poor electrical connection between the dies and the substrate.

In the present disclosure, a semiconductor structure is disclosed. The semiconductor structure includes a substrate, a redistribution layer (RDL) disposed over the substrate, several conductive pillars disposed over the RDL, several dies electrically connected with the substrate by the conductive pillars, and a molding surrounding the dies. The dies are in various thicknesses, and the conductive pillars are in various heights correspondingly. As such, the thickness difference of the dies would be compensated by the conductive pillars in different heights, and the backsides of the dies would be disposed at a level same as each other and would be exposed from the molding. Since no molding is present over the backsides of the dies, the warpage of the semiconductor structure after thermal operations such as reflow would be prevented or minimized, and the electrical connection between the dies and the substrate would be improved. A reliability and performance of the semiconductor structure is improved.

Figure 2:
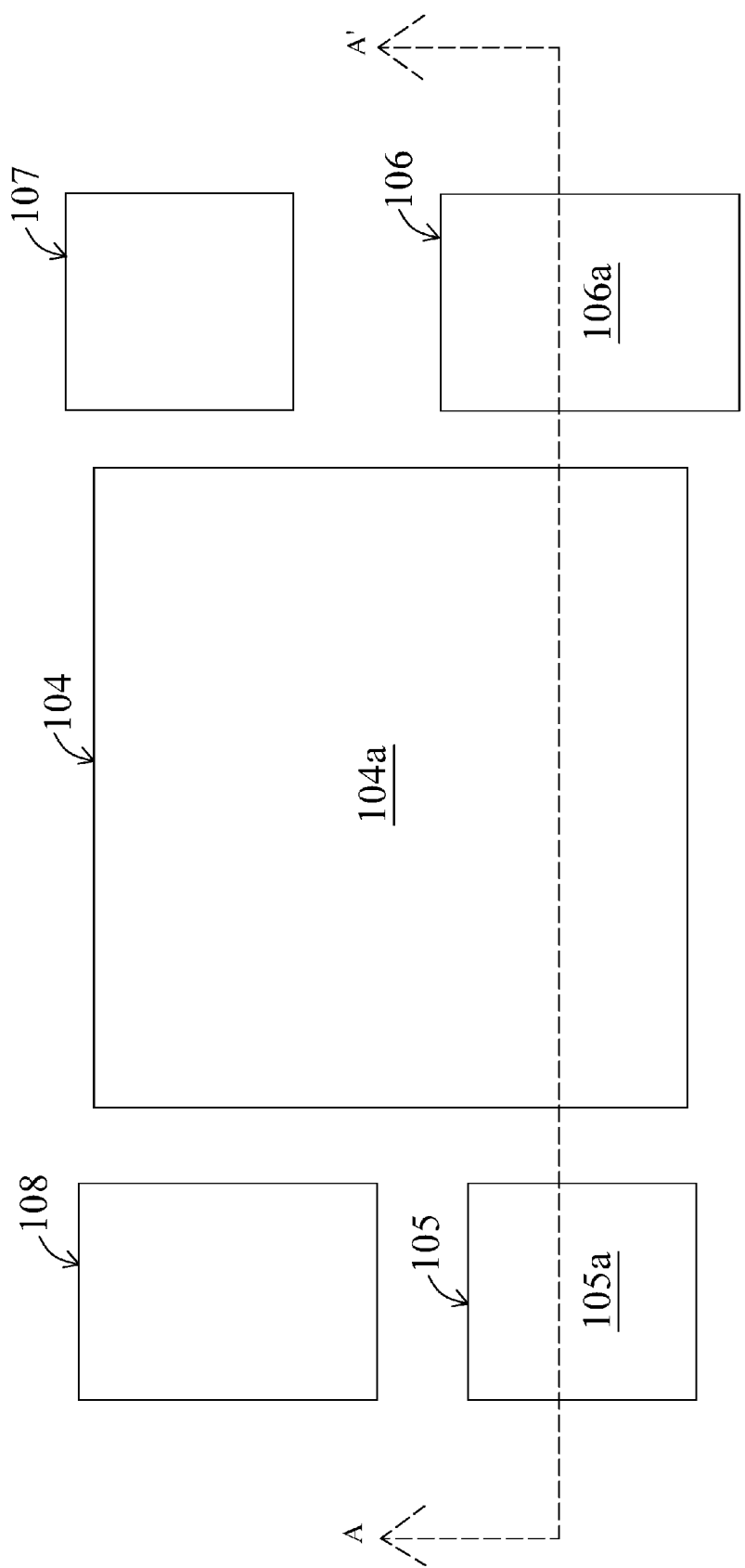
FIG. 2 is a top cross sectional view of the semiconductor structure of FIG. 1.

FIG. 1 is a schematic cross sectional view of a semiconductor structure 100 in accordance with various embodiments of the present disclosure. FIG. 2 is a top view of the semiconductor structure 100 of FIG. 1. FIG. 1 shows the cross sectional view of the semiconductor structure 100 along AA' in FIG. 2. In some embodiments, the semiconductor structure 100 includes a substrate 101, a redistribution layer (RDL) 102, several conductive pillars 103, a first die 104 and a second die (105 or 106). In some embodiments, the semiconductor structure 100 includes several dies (107 or 108). In some embodiments, the semiconductor structure 100 is a semiconductor package. In some embodiments, the semiconductor structure 100 is a multiple dimensional package such as 2.5 dimensional package.

In some embodiments, the substrate 101 is fabricated with a predetermined functional circuit thereon. In some embodiments, the substrate 101 includes several conductive lines and several electrical components such as transistor, diode, etc. connected by the conductive lines. In some embodiments, the substrate 101 is a semiconductive substrate. In some embodiments, the substrate 101 is an interposer or a wafer. In some embodiments, the substrate 101 is a silicon substrate or silicon wafer. In some embodiments, the substrate 101 includes semiconductive material such as silicon, germanium, gallium, arsenic, and combinations thereof. In some embodiments, the substrate 101 includes material such as ceramic, glass, organic, etc. In some embodiments, the substrate 101 is a glass substrate or glass wafer. In some embodiments, the substrate 101 is in a quadrilateral, rectangular, square, polygonal or any other suitable shapes.

In some embodiments, the substrate 101 includes a first surface 101a and a second surface 101b opposite to the first surface 101a. In some embodiments, the first surface 101a is a front side or an active side that the circuits are disposed thereon. In some embodiments, the second surface 101b is a back side or an inactive side.

In some embodiments, the RDL 102 is disposed over the substrate 101. In some embodiments, the RDL 102 is disposed over the first surface 101a of the substrate 101. In some embodiments, the RDL 102 is electrically connected with the substrate 101. In some embodiments, the RDL 102 re-routes paths from the substrate 101 to redistribute I/O terminals of the substrate 101. In some embodiments, the RDL 102 includes a dielectric layer 102a and several conductive members 102b. In some embodiments, the dielectric layer 102a is disposed over the substrate 101. In some embodiments, the dielectric layer 102a is disposed over the first surface 101a of the substrate 101. In some embodiments, the dielectric layer 102a includes several layers of dielectric material stacking over each other. In some embodiments, the dielectric layer 102a includes dielectric material such as silicon oxide, silicon nitride, silicon carbide, silicon oxynitride or the like.

In some embodiments, the conductive members 102b are disposed over the substrate 101 and surrounded by the dielectric layer 102a. In some embodiments, the conductive members 102b are extended through the dielectric layer 102a. In some embodiments, the conductive structure 104b is configured to electrically connect the circuitry of the substrate 101 with a circuitry external to the substrate 101. In some embodiments, each of the conductive members 102b includes gold, silver, copper, nickel, tungsten, aluminum, titanium, palladium and/or alloys thereof.

In some embodiments, the conductive member 102b includes a pad portion 102b-1, a via portion 102b-2 and an extending portion 102b-3. In some embodiments, the extending portion 102b-3 is disposed over the first surface 101a of the substrate 101 and configured to electrically connect with the circuitry of the substrate 101. In some embodiments, the via portion 102b-2 is disposed over the extending portion 102b-3 and extended through a portion of the dielectric layer 102a towards the extending portion 102b-3.

In some embodiments, the pad portion 102b-1 is disposed over and coupled with the via portion 102b-2. In some embodiments, the pad portion 102b-1 is electrically connected with the extending portion 102b-3 through the via portion 102b-2. In some embodiments, the pad portion 102b-1 is electrically connected with the substrate 101 through the extending portion 102b-3 and the via portion 102b-2. In some embodiments, a portion of the pad portion 102b-1 is exposed from the dielectric layer 102a and is configured to receive a conductive structure subsequently disposed. In some embodiments, a seed layer is disposed over the pad portion 102b-1 exposed from the dielectric layer 102a. In some embodiments, the seed layer includes gold, silver, copper, nickel, tungsten, aluminum, titanium, palladium and/or alloys thereof.

In some embodiments, several conductive pillars 103 are disposed over and electrically connected with the conductive members 102b respectively. In some embodiments, each of the conductive pillars 103 is extended from the corresponding conductive member 102b. In some embodiments, the conductive pillar 103 includes conductive material such as copper, gold, aluminum, etc. In some embodiments, the conductive pillar 103 is in a cylindrical shape. In some embodiments, a top cross section (a cross section from the top view of the semiconductor structure 100) of the conductive pillar 103 is in various shapes such as circular shape, quadrilateral shape or polygonal shape. In some embodiments, the conductive member 102b or the pad portion 102b-1 is configured to receive the conductive pillar 103. In some embodiments, the conductive pillars 103 have various heights. The heights of the conductive pillars 103 are different from each other.

In some embodiments, the conductive pillars 103 includes a first conductive pillar 103a and a second conductive pillar 103b. In some embodiments, the first conductive pillar 103a is disposed over and electrically connected with one of the conductive members 102b, and the second conductive pillar 103b is disposed over and electrically connected with another one of the conductive members 102b. In some embodiments, the second conductive pillar 103b surrounds the first conductive pillar 103a. In some embodiments, the first conductive pillar 103a or the second conductive pillar 103b is protruded from the RDL 102 and away from the substrate 101. In some embodiments, the first conductive pillar 103a includes same material as or different material from the second conductive pillar 103b. In some embodiments, the first conductive pillar 103a has same configuration as the second conductive pillar 103b. In some embodiments, the second conductive pillar 103b has a height H2 substantially greater than a height H1 of the first conductive pillar 103a. In some embodiments, a ratio of the height H1 to the height H2 is greater than about 1:1.5. In some embodiments, the second conductive pillar 103b is disposed adjacent to an edge of the semiconductor structure 100. In some embodiments, the first conductive pillar 103a is disposed at a central portion of the semiconductor structure 100.

In some embodiments, the first die 104 and the second die (105 or 106) are disposed over the substrate 101, the RDL 102 or the conductive pillars 103. In some embodiments, the first die 104 is electrically connected with at least one of the conductive pillars 103. In some embodiments, the first die 104 is disposed over the RDL 102 and electrically connected with the first conductive pillar 103*a*. In some embodiments, the first die 104 is a small piece including semiconductive materials such as silicon, and is fabricated with a predetermined functional circuit within the first die 104 produced by photolithography operations. In some embodiments, the first die 104 is singulated from a silicon wafer by a mechanical or laser blade. In some embodiments, the first die 104 is a chip, a device or the like. In some embodiments, the first die 104 comprises a variety of electrical circuits suitable for a particular application. In some embodiments, the electrical circuits include various devices such as transistors, capacitors, resistors, diodes and/or the like. In some embodiments, the first die 104 has a top cross section (a cross section from a top view of the semiconductor structure 100) in a quadrilateral, a rectangular or a square shape.

In some embodiments, the first die 104 includes a first die substrate 104*a*, a first side 104*b*, a second side 104*c* opposite to the first side 104*b* and a first die pad 104*d* disposed over the first side 104*b*. In some embodiments, the first die substrate 104*a* includes semiconductive material such as silicon or etc. In some embodiments, the first side 104*b* is a front side or an active side of the first die 104. In some embodiments, the first side 104*b* faces to the conductive pillars 103, the RDL 102 or the substrate 101. In some embodiments, the second side 104*c* is a back side or an inactive side of the first die 104. In some embodiments, the first die pad 104*d* includes conductive material such as copper, aluminum, gold or etc. In some embodiments, the first die pad 104*d* is electrically connected with a circuitry of the first die substrate 104*a*. In some embodiments, the first die pad 104*d* is a conductive pillar protruded from the first side 104*b* of the first die substrate 104*a*. In some embodiments, the first die pad 104*d* is in a cylindrical shape.

In some embodiments, the first die 104 is electrically connected with the first conductive pillar 103*a* by a first conductive bump 107*a*. In some embodiments, the first conductive bump 107*a* is disposed between the first die 104 and the first conductive pillar 103*a*. In some embodiments, the first die pad 104*d* is electrically connected with the first conductive pillar 103*a* by the first conductive bump 107*a*. In some embodiments, the first conductive bump 107*a* is in a cylindrical, hemispherical or spherical shape. In some embodiments, the first conductive bump 107*a* is an electrical connector, a solder joint, a solder bump, a solder ball, a ball grid array (BGA) ball, controlled collapse chip connection (C4) bump, microbump, a pillar or the like or etc. In some embodiments, the first conductive bump 107*a* includes conductive material such as includes solder, copper, nickel, gold or etc. In some embodiments, a soldering material is disposed between the first conductive pillar 103*a* and the first conductive bump 107*a*.

In some embodiments, the second die (105 or 106) is electrically connected with at least one of the conductive pillars 103. In some embodiments, the second die (105 or 106) is disposed over the RDL 102 and electrically connected with the second conductive pillar 103*b*. In some embodiments, the second die (105 or 106) surrounds the first die 104. In some embodiments, the second die (105 or 106) is a small piece including semiconductive materials such as silicon, and is fabricated with a predetermined functional circuit within the second die (105 or 106) produced by photolithography operations. In some embodiments, the second die (105 or 106) is singulated from a silicon wafer by a mechanical or laser blade. In some embodiments, the second die (105 or 106) is a chip, a device or the like. In some embodiments, the second die (105 or 106) comprises a variety of electrical circuits suitable for a particular application. In some embodiments, the electrical circuits include various devices such as transistors, capacitors, resistors, diodes and/or the like. In some embodiments, the second die (105 or 106) has a top cross section (a cross section from a top view of the semiconductor structure 100) in a quadrilateral, a rectangular or a square shape. In some embodiments, the second die (105 or 106) is disposed more adjacent to an edge of the semiconductor structure 100 than the first die 104. In some embodiments, the second die (105 or 106) is disposed to surround the first die 104 from a top view perspective.

In some embodiments, the second die (105 or 106) includes a second die substrate (105*a* or 106*a*), a third side (105*b* or 106*b*), a fourth side (105*c* or 106*c*) opposite to the third side (105*b* or 106*b*) and a second die pad (105*d* or 106*d*) disposed over the third side (105*b* or 106*b*). In some embodiments, the second die substrate (105*a* or 106*a*) includes semiconductive material such as silicon or etc. In some embodiments, the third side (105*b* or 106*b*) is a front side or an active side of the second die (105 or 106). In some embodiments, the third side (105*b* or 106*b*) faces to the conductive pillars 103, the RDL 102 or the substrate 101. In some embodiments, the fourth side (105*c* or 106*c*) is a back side or an inactive side of the second die (105 or 106). In some embodiments, the second die pad (105*d* or 106*d*) includes conductive material such as copper, aluminum, gold or etc. In some embodiments, the second die pad (105*d* or 106*d*) is electrically connected with a circuitry of the second die substrate (105*a* or 106*a*). In some embodiments, the second die pad (105*d* or 106*d*) is a conductive pillar protruded from the third side (105*b* or 106*b*) of the second die substrate (105*a* or 106*a*). In some embodiments, the second die pad (105*d* or 106*d*) is in a cylindrical shape.

In some embodiments, the second die (105 or 106) is electrically connected with the second conductive pillar 103*b* by a second conductive bump 107*b*. In some embodiments, the second conductive bump 107*b* is disposed between the second die (105 or 106) and the second conductive pillar 103*b*. In some embodiments, the second die pad 105*d* is electrically connected with the second conductive pillar 103*b* by the second conductive bump 107*b*. In some embodiments, the second conductive bump 107*b* is in a cylindrical, hemispherical or spherical shape. In some embodiments, the second conductive bump 107*b* is an electrical connector, a solder joint, a solder bump, a solder ball, a ball grid array (BGA) ball, controlled collapse chip connection (C4) bump, microbump, a pillar or the like or etc. In some embodiments, the second conductive bump 107*b* includes conductive material such as includes solder, copper, nickel, gold or etc. In some embodiments, a soldering material is disposed between the second conductive pillar 103*b* and the second conductive bump 107*b*.

In some embodiments, the dies (104, 105, 106, 107 or 108) have various thicknesses. The thicknesses of the dies (104, 105, 106, 107 or 108) are different from each other. In some embodiments, a thickness T1 of the first die 104 is substantially different from a thickness T2 of the second die (105 or 106). In some embodiments, the thickness T1 of the first die 104 is substantially greater than the thickness T2 of the second die (105 or 106).

In some embodiments, a distance between the second die (105 or 106) and the RDL 102 is substantially greater than a distance between the first die 104 and the RDL 102. In some embodiments, a distance D2 between the third side (105*b* or 106*b*) and the RDL 102 is substantially greater than a distance D1 between the first side 104b and the RDL 102. In some embodiments, a total height of the first conductive pillar 103a and the first die 104 is substantially same as a total height of the second conductive pillar 103b and the second die 105. In some embodiments, a distance D3 between the second side 104c and the RDL 102 is substantially same as a distance D4 between the fourth side 105c and the RDL 102.

In some embodiments, the second side 104c of the first die 104 and the fourth side (105c or 106c) of the second die (105 or 106) are at substantially same level. In some embodiments, the first side 104b of the first die 104 is at a level substantially different from a level of the third side (105b or 106b) of the second die (105 or 106). In some embodiments, the second side 104c of the first die 104 is horizontally aligned with the fourth side (105c or 106c) of the second die (105 or 106). Since the conductive pillars 103 have different heights, such heights difference can compensate different thicknesses between the first die 104 and the second die (105 or 106). As such, the thicknesses difference between the first die 104 and the second die (105 or 106) is balanced by the conductive pillars 103 in different heights. Thus, the second side 104c of the first die 104 is at a level same as a level of the fourth side (105c or 106c) of the second die (105 or 106).

In some embodiments, dimensions of the dies (104, 105, 106, 107, 108) are different from each other. In some embodiments, a dimension of the first die 104 is substantially greater than a dimension of the second die (105 or 106). In some embodiments, as shown in FIG. 2, the dimension of the first die 104 is substantially greater than the dimension of the second die (105 or 106) and other dies (107 or 108). In some embodiments as shown in FIG. 2, a size of the first die substrate 104a is substantially greater than a size of the second die substrate (105a or 106a). In some embodiments as shown in FIG. 2, a width of the first die substrate 104a is substantially greater than a width of the second die substrate (105a or 106a).

Figure 3:
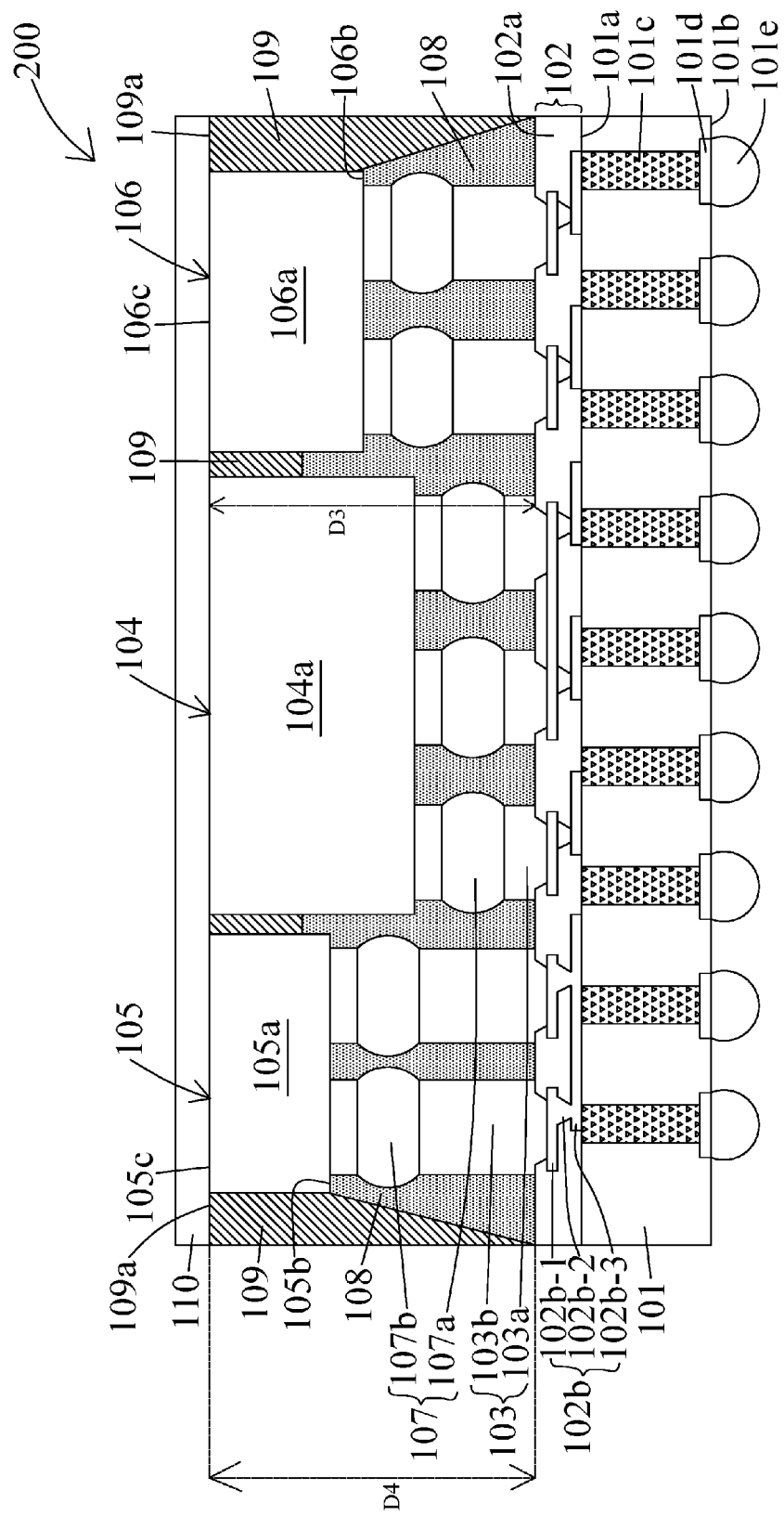
FIG. 3 is a schematic cross sectional view of a semiconductor structure in accordance with some embodiments of the present disclosure.

FIG. 3 is a schematic cross sectional view of a semiconductor structure 200 in accordance with various embodiments of the present disclosure. In some embodiments, the semiconductor structure 200 is a semiconductor package. In some embodiments, the semiconductor structure 200 is a multiple dimensional package such as 2.5 dimensional package. In some embodiments, the semiconductor structure 200 includes a substrate 101, a redistribution layer (RDL) 102, several conductive pillars 103, several conductive bumps 107, a first die 104 and a second die (105 or 106), which have similar configurations as described above or as illustrated in FIG. 1 or 2.

In some embodiments, the semiconductor structure 200 includes an underfill material 108 disposed between the substrate 101 and the first die 104 or between the substrate 101 and the second die (105 or 106). In some embodiments, the underfill material 108 is disposed over the substrate 101 or the RDL 102. In some embodiments, the underfill material 108 fills gaps between the conductive pillars 103 or between the conductive bumps 107. In some embodiments, the underfill material 108 encapsulates the conductive pillars 103 or the conductive bumps 107. In some embodiments, the underfill material 108 contacts with the first side 104b of the first die 104 or the third side (105b or 106b) of the second die (105 or 106). In some embodiments, the underfill material 108 protects the conductive pillars 103 or the conductive bumps 107 from moisture or other environmental hazards, and provides additional mechanical strength to the semiconductor structure 200. In some embodiments, the underfill material 108 covers a sidewall of the second die substrate (105a or 106a) of the second die (105 or 106) and contacts with the dielectric layer 102a of the RDL 102. In some embodiments, the underfill material 108 includes epoxy, resin, polymer, etc.

In some embodiments, the semiconductor structure 200 includes a molding 109 surrounding the first die 104 and the second die (105 or 106). In some embodiments, the molding 109 is disposed over the substrate 101, the RDL 102 or the underfill material 108. In some embodiments, the molding 109 surrounds the underfill material 108. In some embodiments, the molding 109 encapsulates the underfill material 108, the first die 104, the second die (105 or 106), the conductive pillars 103 and the conductive bumps 107. In some embodiments, a portion of the molding 109 is disposed between the first die 104 and the second die (105 or 106). In some embodiments, the molding 109 is interfaced with the underfill material 108 and the sidewall of the second die (105 or 106). In some embodiments, the molding 109 is a single layer film or a composite stack. In some embodiments, the molding 109 includes various materials, such as molding compound, molding underfill, epoxy, resin, or the like. In some embodiments, the molding 109 has a high thermal conductivity, a low moisture absorption rate and a high flexural strength.

In some embodiments, a thickness of the molding 109 is substantially same as the distance D3 between the second side 104c and the RDL 102 or the distance D4 between the fourth side (105c or 106c) and the RDL 102. In some embodiments, at least a portion of the first die 104 and at least a portion of the second die (105 or 106) are exposed from the molding 109. In some embodiments, the second side 104c of the first die 104 and the fourth side (105c or 106c) of the second die (105 or 106) are exposed from the molding 109. In some embodiments, a top surface 109a of the molding 109 is at a level substantially same as the level of the second side 104c of the first die 104 or the level of the fourth side (105c or 106c) of the second die (105 or 106). In some embodiments, no molding 109 is disposed over the first die 104 or the second die (105 or 106), or the molding 109 does not cover the first die 104 or the second die (105 or 106). As such, the semiconductor structure 100 after thermal operations such as reflow operations would not be bended or curved. Therefore, warpage of the semiconductor structure 100 can be minimized or avoided. Furthermore, since the warpage of the semiconductor structure 100 is minimized or avoided, cold joint (i.e. some of the conductive bumps 107 are disposed away from or do not bond with the corresponding conductive pillars 103 due to the bending of the semiconductor structure 100) would be minimized or would not be present. As such, electrical connection between the conductive pillars 103 and the conductive bumps 107 are improved.

In some embodiments, the semiconductor structure 200 includes a heat dissipation means 110 such as heat sink, heat spreader or etc. disposed over the first die 104, the second die (105 or 106) and the molding 109. In some embodiments, the heat dissipation means 110 contacts with the first die 104 and the second die (105 or 106) in order to dissipate heat from the first die 104 or the second die (105 or 106). In some embodiments, the heat dissipation means 110 contacts with the second side 104c of the first die 104 and the fourth side (105c or 106c) of the second die (105 or 106).

In some embodiments, a bond pad 101d is disposed over or within the substrate 101. In some embodiments, the bond pad 101d is disposed over the second surface 101b of the substrate 101. In some embodiments, the bond pad 101d includes conductive material copper, silver, nickel, aluminum, gold, titanium or tungsten, etc. In some embodiments, the bond pad 101*d* is configured to receive a conductive structure.

In some embodiments, the substrate 101 includes a via 101*c* extending through the substrate 101. In some embodiments, the via 101*c* includes conductive material such as copper, silver, nickel, aluminum, gold, titanium or tungsten, etc. In some embodiments, the via 101*c* is disposed between and electrically connected with the conductive member 102*b* and the bond pad 101*d*. In some embodiments, the via 101*c* is electrically connected with the first die 104 or the second die (105 or 106) through the conductive bump 107, the conductive pillar 103 and the conductive member 102*b*. In some embodiments, the via 101*c* is a through silicon via (TSV).

In some embodiments, a connector 101*e* is disposed over and electrically connected with the bond pad 101*d*. In some embodiments, the connector 101*e* is electrically connected with the via 101*c* and the conductive member 102*b* through the bond pad 101*d*. In some embodiments, the connector 101*e* is in a cylindrical, hemispherical or spherical shape. In some embodiments, the connector 101*e* is a solder joint, a solder bump, a solder ball, a ball grid array (BGA) ball, controlled collapse chip connection (C4) bump, microbump, a pillar or the like or etc. In some embodiments, the connector 101*e* includes conductive material such as includes solder, copper, nickel, gold or etc.

Figure 4:
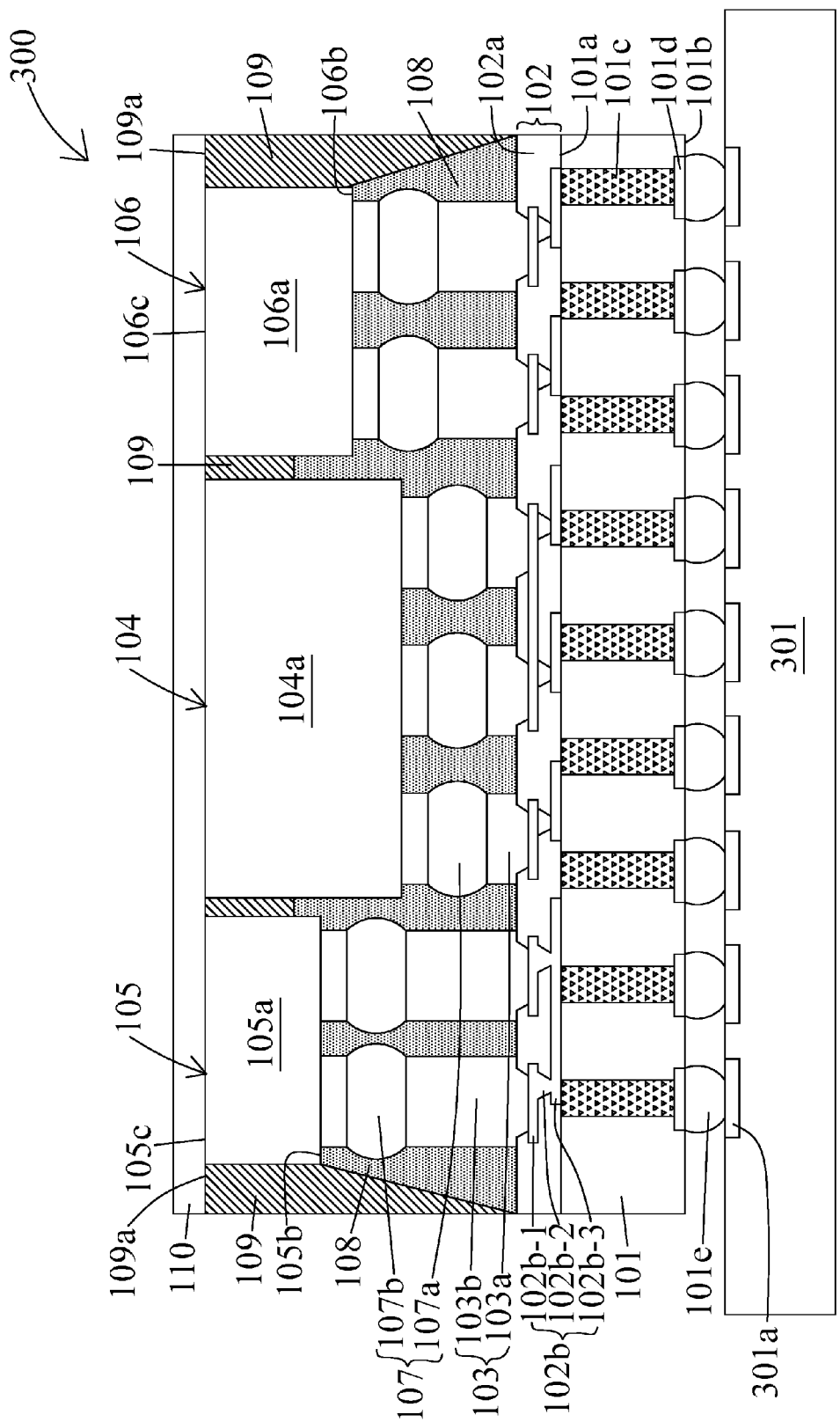
FIG. 4 is a schematic cross sectional view of a semiconductor structure in accordance with some embodiments of the present disclosure.

FIG. 4 is a schematic cross sectional view of a semiconductor structure 300 in accordance with various embodiments of the present disclosure. In some embodiments, the semiconductor structure 300 is a semiconductor package or an integrated circuit (IC) package. In some embodiments, the semiconductor structure 300 is a multiple dimensional package such as 2.5 dimensional package. In some embodiments, the semiconductor structure 300 includes a substrate 101, a redistribution layer (RDL) 102, several conductive pillars 103, several conductive bumps 107, a first die 104, a second die (105 or 106), a underfill material 108, a molding 109 and a heat dissipation means 110, which have similar configurations as described above or as illustrated in any one of FIGS. 1-3.

In some embodiments, the semiconductor structure 300 includes a board 301 and a pad 301*a* disposed over the board 301. In some embodiments, the semiconductor structure 200 of FIG. 3 is disposed over the board 301 and bonded with the pad 301*a*. In some embodiments, the board 301 includes semiconductive material such as silicon. In some embodiments, the board 301 is fabricated with a predetermined functional circuit. In some embodiments, the board 301 is a substrate, a device board, a printed circuit board (PCB), etc. In some embodiments, the pad 301*a* includes conductive material such as copper, silver, nickel, aluminum, gold, titanium or tungsten, etc. In some embodiments, the pad 301*a* is electrically connected with a circuitry of the board 301. In some embodiments, the pad 301*a* is configured to receive a conductive structure. In some embodiments, the pad 301*a* is electrically connected with and bonded with the connector 101*e*. In some embodiments, the connector 101*e* is disposed over the pad 301*a*. In some embodiments, the board 301, the substrate 101, the first die 104 and the second die (105 or 106) are electrically connected through the conductive bump 107, the conductive pillar 103, the conductive member 102*b*, the via 101*c*, the bond pad 101*d* and the connector 101*e*.

Figure 5:
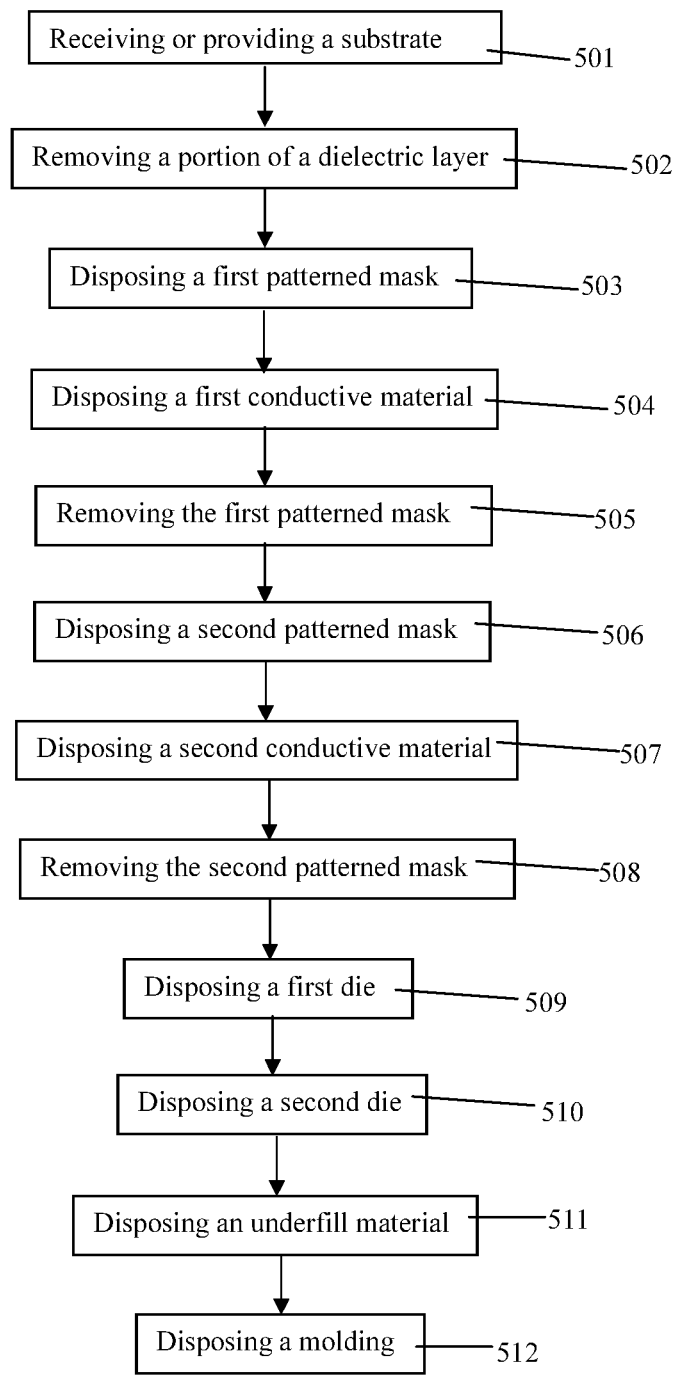
FIG. 5 is a flow diagram of a method of manufacturing a semiconductor structure in accordance with some embodiments of the present disclosure.

In the present disclosure, a method of manufacturing a semiconductor structure (100, 200 or 300) is also disclosed. In some embodiments, a semiconductor structure (100, 200 or 300) is formed by a method 500. The method 500 includes a number of operations and the description and illustration are not deemed as a limitation as the sequence of the operations. FIG. 5 is an embodiment of the method 500 of manufacturing a semiconductor structure (100, 200 or 300). The method 500 includes a number of operations (501, 502, 503, 504, 505, 506, 507, 508, 509, 510, 511 and 512).

Figure 5A:
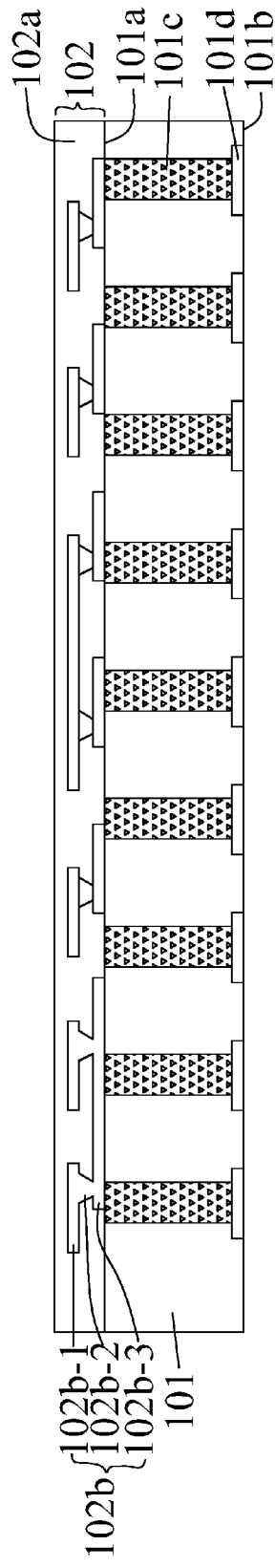
FIGS. 5A-5N are schematic views of manufacturing a semiconductor structure by a method of FIG. 5 in accordance with some embodiments of the present disclosure.

In operation 501, a substrate 101 is provided or received as shown in FIG. 5A. In some embodiments, the substrate 101 is an interposer or a wafer. In some embodiments, the substrate 101 includes semiconductive material such as silicon. In some embodiments, the substrate 101 has similar configuration as described above or illustrated in any one of FIGS. 1-4. In some embodiments, the substrate 101 includes a RDL 102 disposed over the substrate 101. In some embodiments, the RDL 102 includes a dielectric layer 102*a* disposed over the substrate 101 and a conductive member 102*b*. In some embodiments, the dielectric layer 102*a* is disposed by spin coating, deposition, chemical vapor deposition (CVD) or any other suitable operations. In some embodiments, the conductive member 102*b* is formed by sputtering, electroplating or any other suitable operations. In some embodiments, the substrate 101 includes a via 101*c* and a bond pad 101*d*. In some embodiments, the RDL 102, the dielectric layer 102*a*, the conductive member 102*b*, the via 101*c* and the bond pad 101*d* have similar configuration as described above or illustrated in any one of FIGS. 1-4.

Figure 5B:
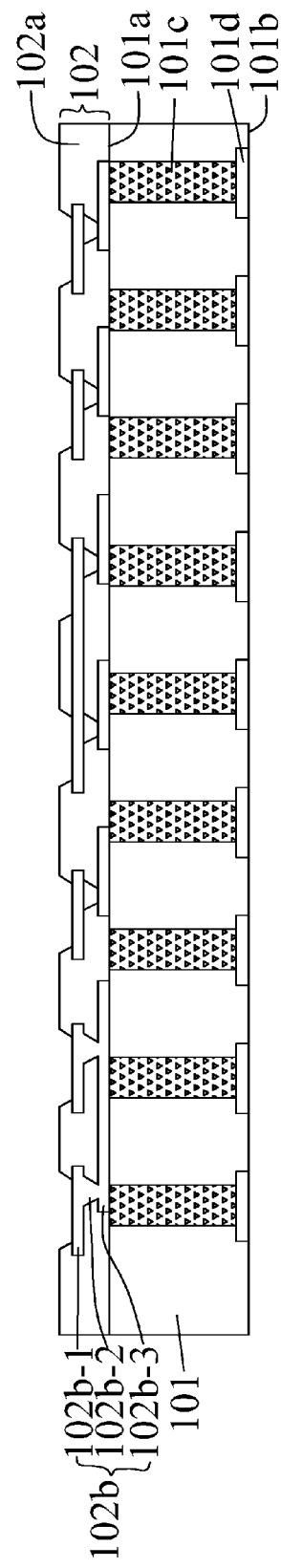

In operation 502, a portion of the dielectric layer 102*a* is removed as shown in FIG. 5B. In some embodiments, the portion of the dielectric layer 102*a* is removed by any suitable operations such as etching operations, etc., such that a portion of a pad portion 102*b*-1 of a conductive member 102*b* of the RDL 102 is exposed. In some embodiments, a seed layer is disposed over the dielectric layer 102*a* and the portion of the pad portion 102*b*-1 exposed from the dielectric layer 102*a*. In some embodiments, the seed layer is disposed between the dielectric layer 102*a* and the first patterned mask 401. In some embodiments, the seed layer includes conductive material such as copper, titanium, etc.

Figure 5C:
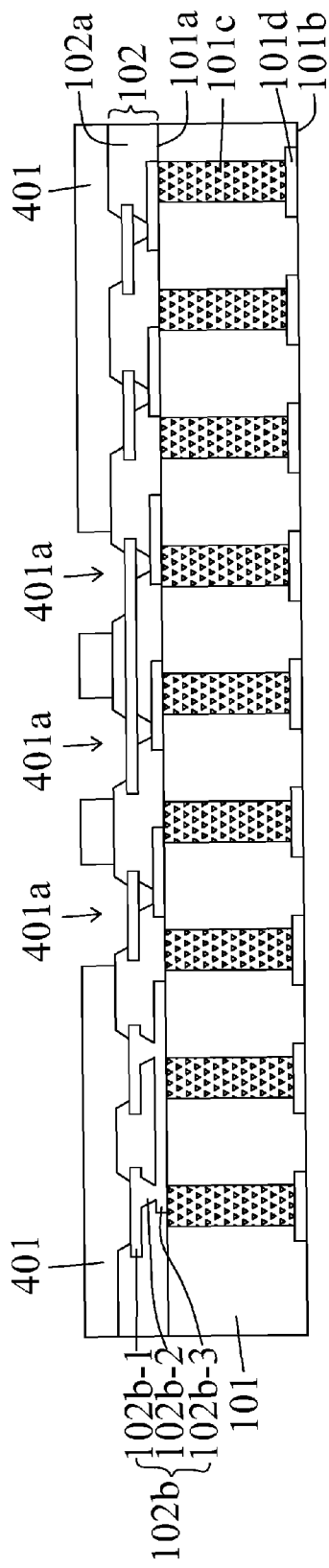

In operation 503, a first patterned mask 401 is disposed over the RDL 102 as shown in FIG. 5C. In some embodiments, the first patterned mask 401 includes a first recess 401*a* corresponding to the portion of the pad portion 102*b*-1 exposed from the dielectric layer 102*a*. In some embodiments, the first patterned mask 401 is formed by disposing a photoresist (PR) over the dielectric layer 102*a* by deposition or any other suitable operations, and removing some portions of the PR by photolithography and etching operations to form the first recess 401*a*.

Figure 5D:
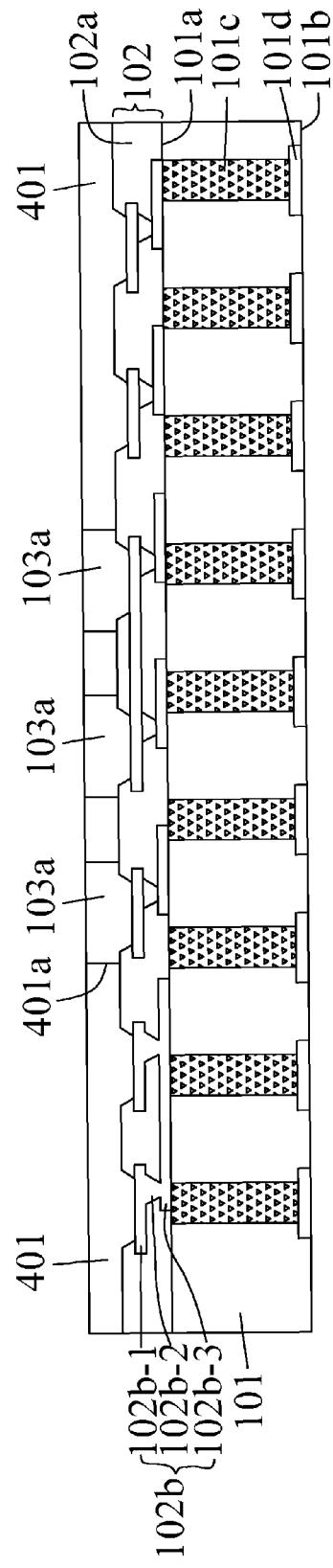

In operation 504, a first conductive material is disposed over the RDL 102 exposed from the first patterned mask 401 to form a first conductive pillar 103*a* as shown in FIG. 5D. In some embodiments, the first conductive material is disposed over the portion of the pad portion 102*b*-1 exposed from the first patterned mask 401. In some embodiments, the first conductive material is disposed by electroplating or any other suitable operations. In some embodiments, the first conductive pillar 103*a* is formed over the pad portion 102*b*-1 and electrically connected with the conductive member 102*b*. In some embodiments, a height of the first conductive pillar 103*a* is substantially same as a thickness of the first patterned mask 401. In some embodiments, the first conductive pillar 103*a* has similar configuration as described above or illustrated in any one of FIGS. 1-4.

Figure 5E:
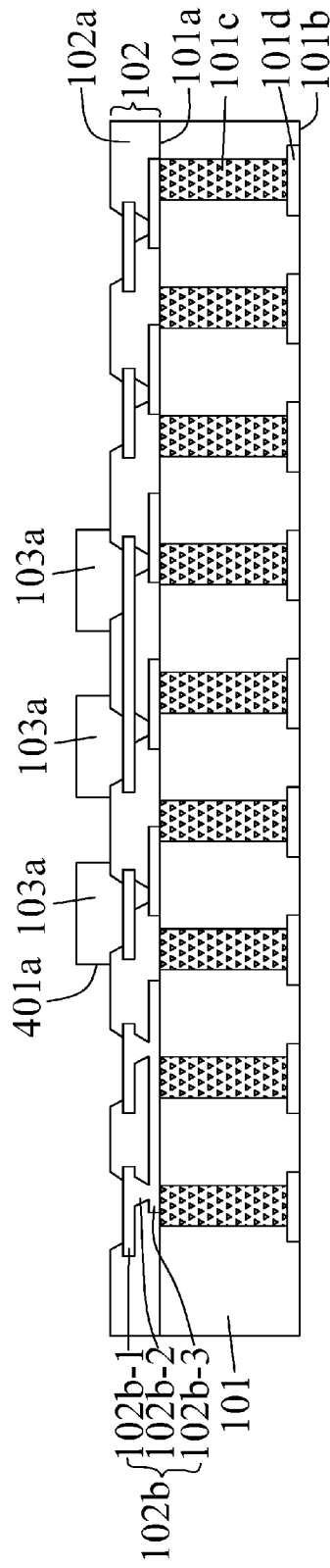

In operation 505, the first patterned mask 401 is removed as shown in FIG. 5E. In some embodiments, the first patterned mask 401 is removed by etching, stripping or any other suitable operations. In some embodiments, a soldering material is disposed over the first conductive pillar 103a.

Figure 5F:
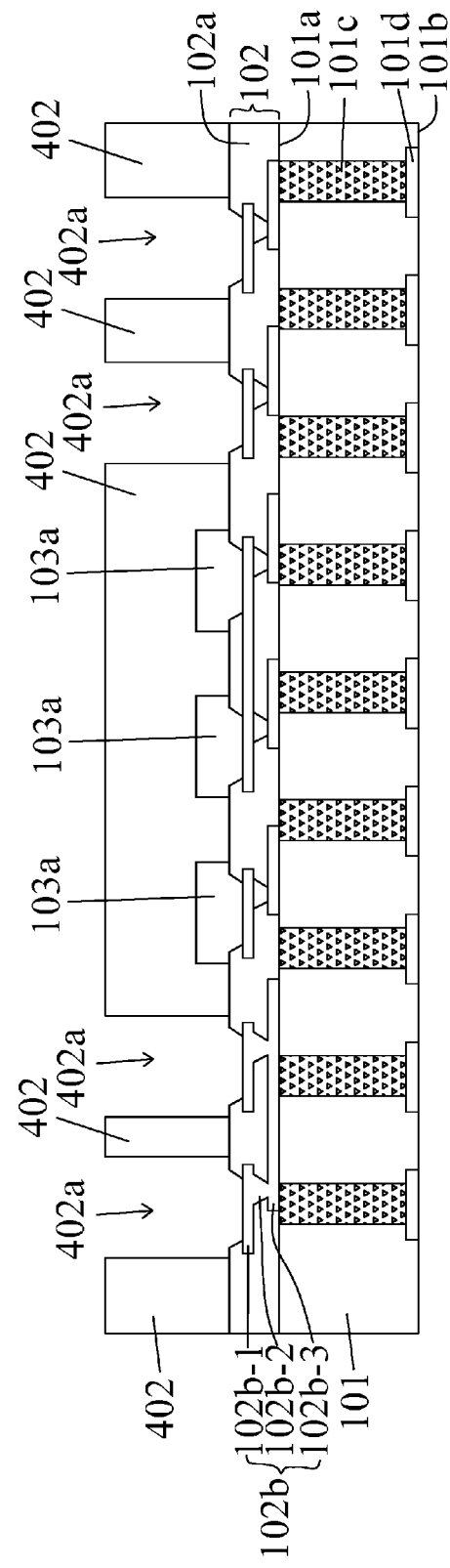

In operation 506, a second patterned mask 402 is disposed over the RDL 102 as shown in FIG. 5F. In some embodiments, the second patterned mask 402 includes a second recess 402a corresponding to a portion of the pad portion 102b-1 exposed from the dielectric layer 102a. In some embodiments, the second patterned mask 402 is formed by disposing a photoresist (PR) over the dielectric layer 102a by deposition or any other suitable operations, and removing some portions of the PR by photolithography and etching operations to form the second recess 402a. In some embodiments, a thickness of the second patterned mask 402 is substantially greater than a thickness of the first patterned mask 401.

Figure 5G:
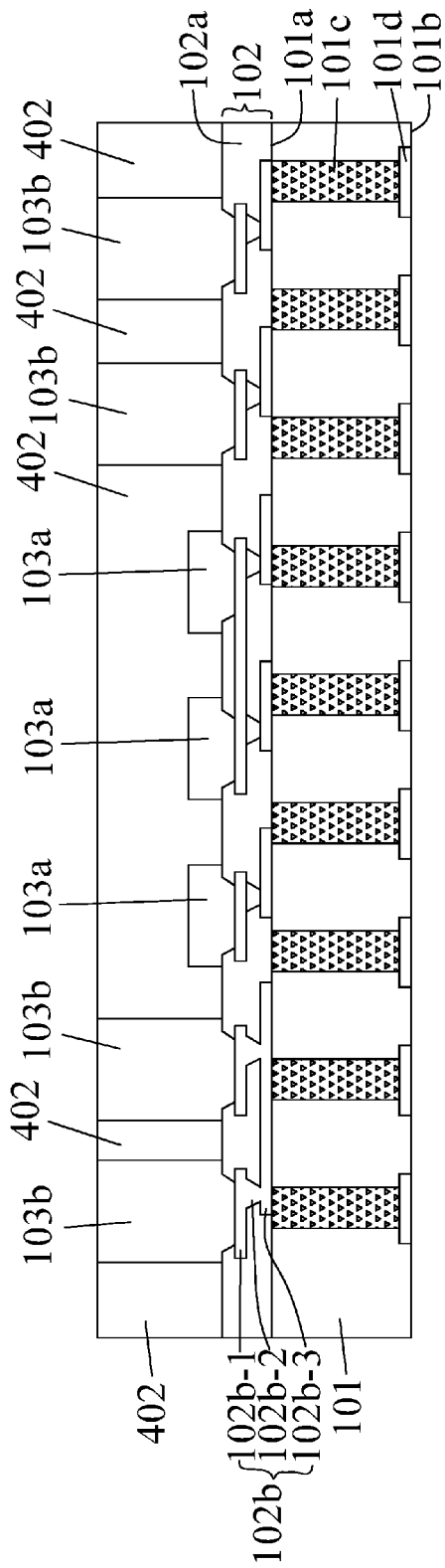

In operation 507, a second conductive material is disposed over the RDL 102 exposed from the second patterned mask 402 to form a second conductive pillar 103b as shown in FIG. 5G. In some embodiments, the second conductive material is disposed over the portion of the pad portion 102b-1 exposed from the second patterned mask 402. In some embodiments, the second conductive material is disposed by electroplating or any other suitable operations. In some embodiments, the second conductive pillar 103b is formed over the pad portion 102b-1 and electrically connected with the conductive member 102b. In some embodiments, a height of the second conductive pillar 103b is substantially same as a thickness of the second patterned mask 402. In some embodiments, the height of the second conductive pillar 103b is substantially greater than a height of the first conductive pillar 103a. In some embodiments, the second conductive pillar 103b has similar configuration as described above or illustrated in any one of FIGS. 1-4.

Figure 5H:
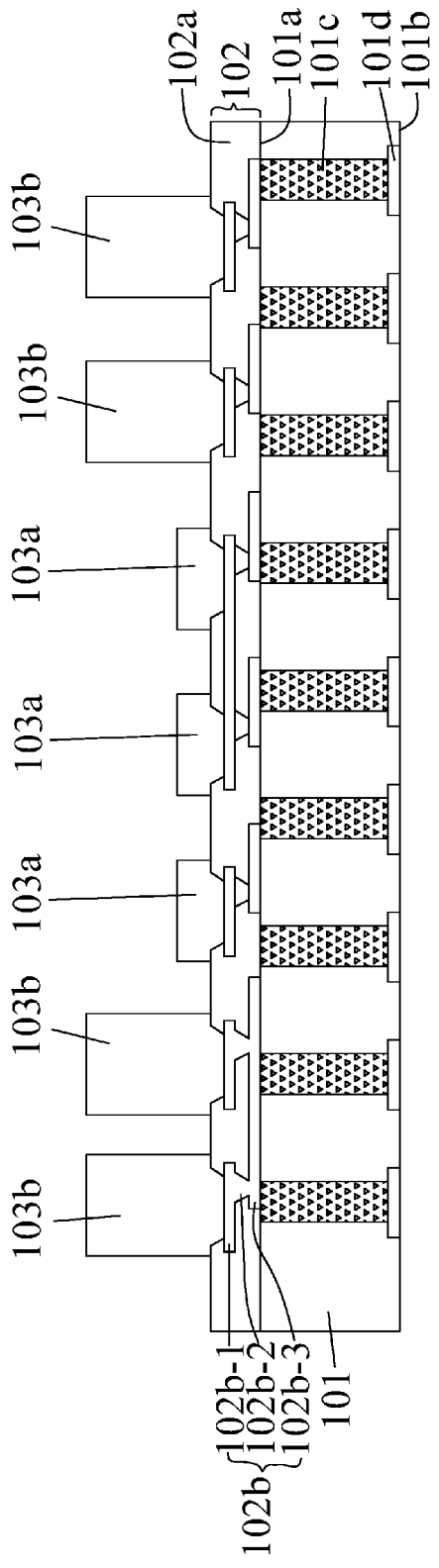

In operation 508, the second patterned mask 402 is removed as shown in FIG. 5H. In some embodiments, the second patterned mask 402 is removed by etching, stripping or any other suitable operations. In some embodiments, a soldering material is disposed over the second conductive pillar 103b.

Figure 5I:
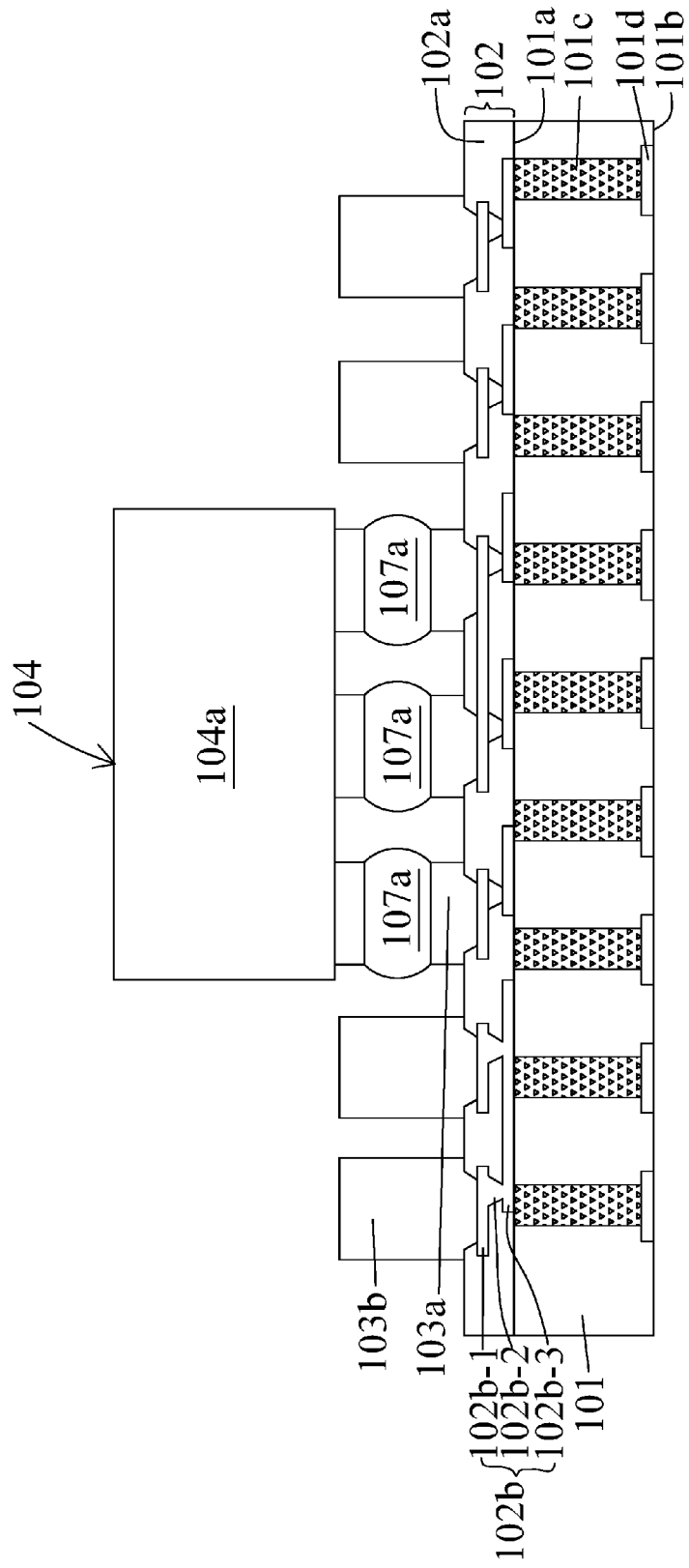

In operation 509, a first die 104 is disposed over the first conductive pillar 103a as shown in FIG. 5I. In some embodiments, the first die 104 is bonded with the first conductive pillar 103a by a first conductive bump 107a. In some embodiments, the first conductive bump 107a is formed by ball dropping, solder pasting or any other suitable operations. In some embodiments, the first die 104 and the first conductive bump 107a have similar configuration as described above or illustrated in any one of FIGS. 1-4.

Figure 5J:
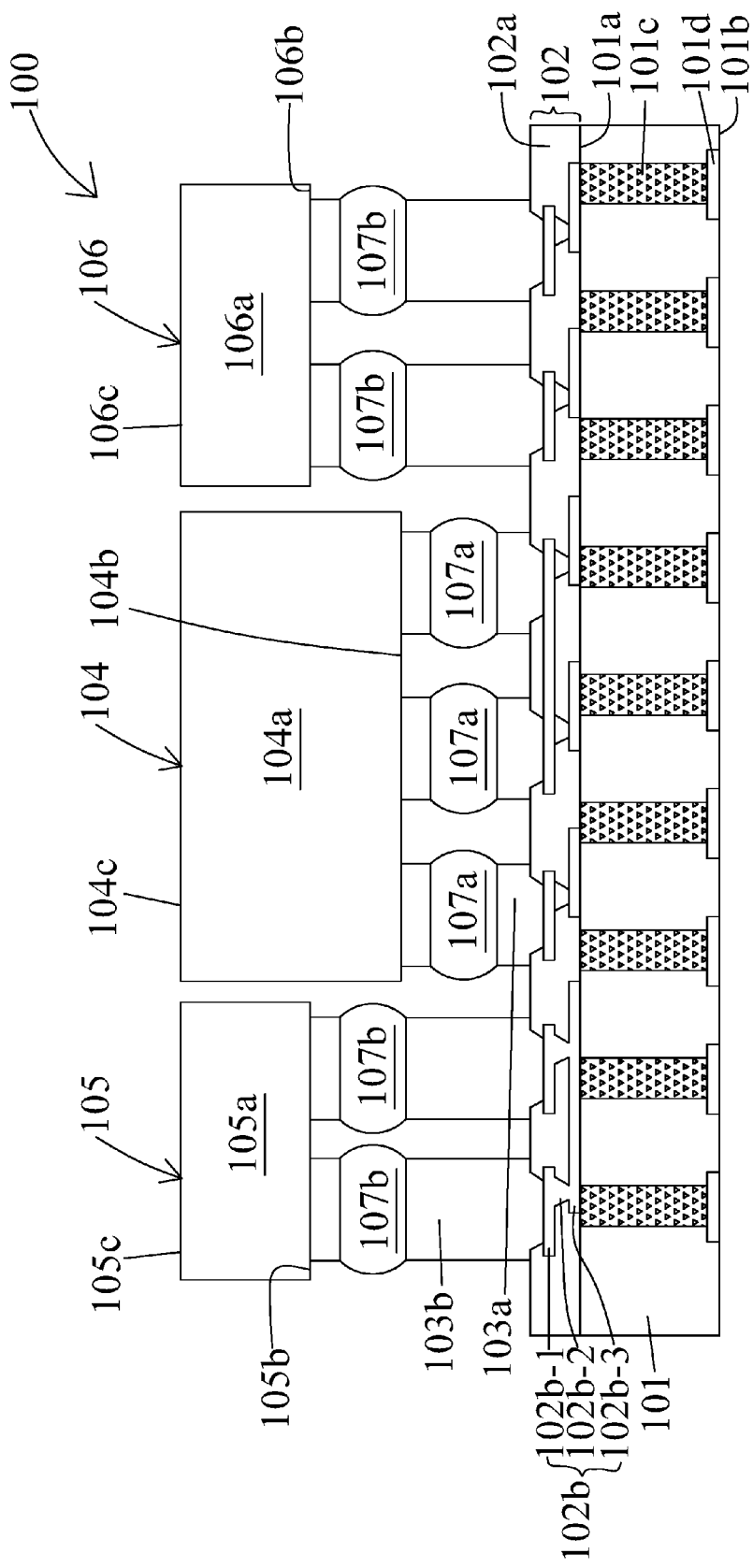

In operation 510, a second die (105 or 106) is disposed over the second conductive pillar 103b as shown in FIG. 5J. In some embodiments, the second die (105 or 106) is bonded with the second conductive pillar 103b by a second conductive bump 107b. In some embodiments, the second conductive bump 107b is formed by ball dropping, solder pasting or any other suitable operations. In some embodiments, a second side 104c of the first die 104 is at a level substantially same as a level of a fourth side (105c or 106c) of the second die (105 or 106). In some embodiments, the second die (105 or 106) and the second conductive bump 107b have similar configuration as described above or illustrated in any one of FIGS. 1-4. In some embodiments, a semiconductor structure 100 is formed which has similar configuration as illustrated in FIG. 1.

Figure 5K:
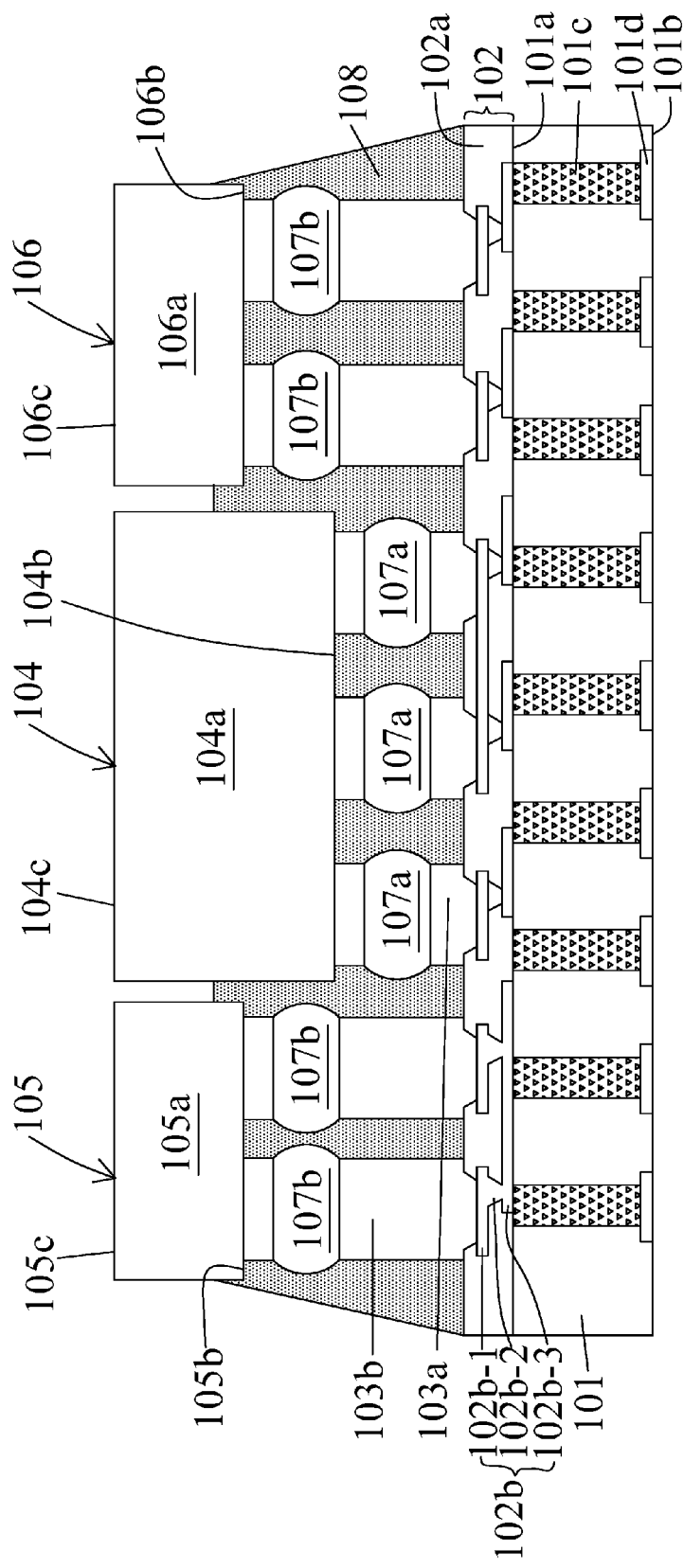

In operation 511, an underfill material 108 is disposed over the substrate 101 as shown in FIG. 5K. In some embodiments, the underfill material 108 encapsulates the first conductive pillar 103a, the second conductive pillar 103b, the first conductive bump 107a and the second conductive bump 107b. In some embodiments, the underfill material 108 has similar configuration as described above or illustrated in any one of FIGS. 1-4.

Figure 5L:
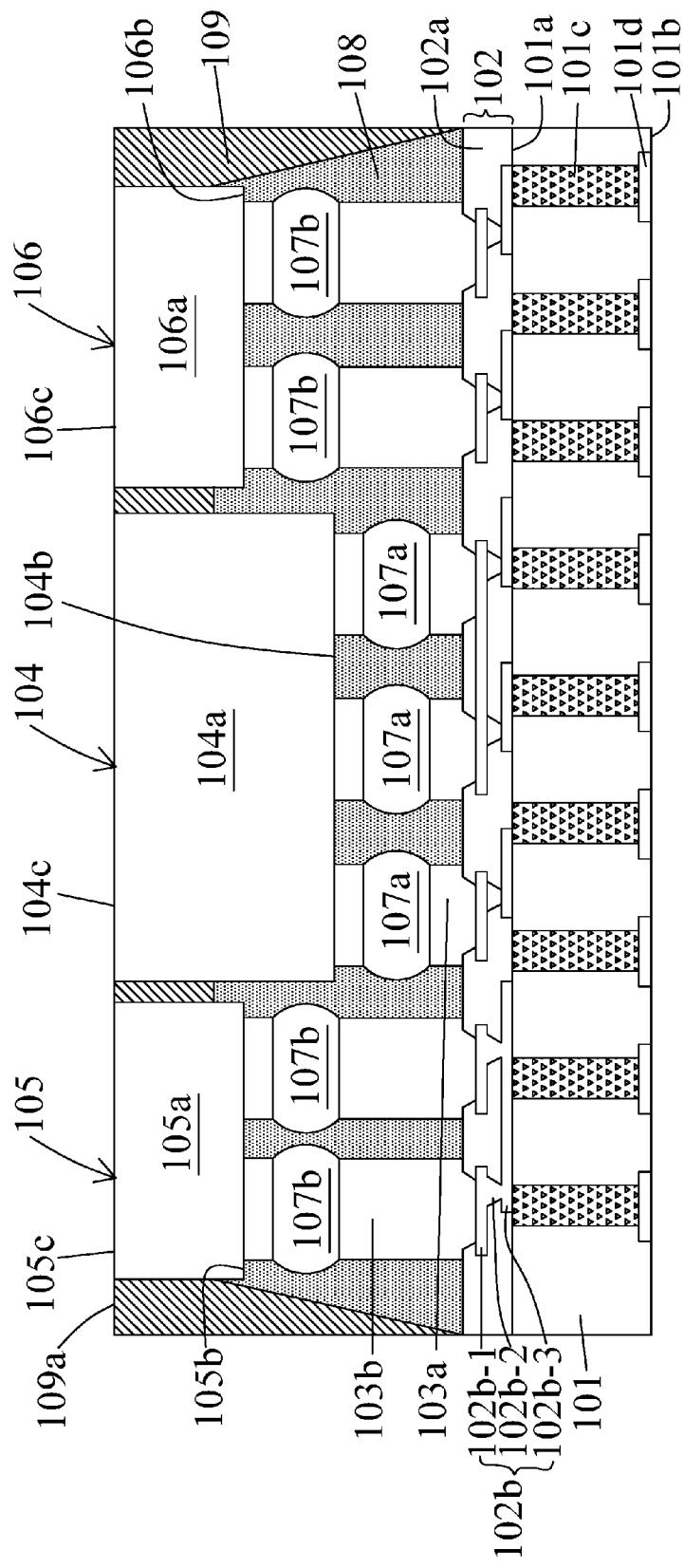

In operation 512, a molding 109 is disposed over the substrate 101 as shown in FIG. 5L. In some embodiments, the molding 109 surrounds the underfill material 108, the first die 104 and the second die (105 or 106). In some embodiments, the molding 109 is formed by disposing a molding material such as molding compound, epoxy or etc. over the underfill material 108 and the substrate 101. In some embodiments, the molding 109 is disposed by transfer molding, compression molding or any other suitable operations. In some embodiments, the second side 104c of the first die 104 and the fourth side (105c or 106c) of the second die (105 or 106) are exposed from the molding 109. In some embodiments, a top surface 109a of the molding 109 is at a level substantially same as a level of the second side 104c of the first die 104 and a level of the fourth side (105c or 106c) of the second die (105 or 106). In some embodiments, the molding 109 has similar configuration as described above or illustrated in any one of FIGS. 1-4.

Figure 5M:
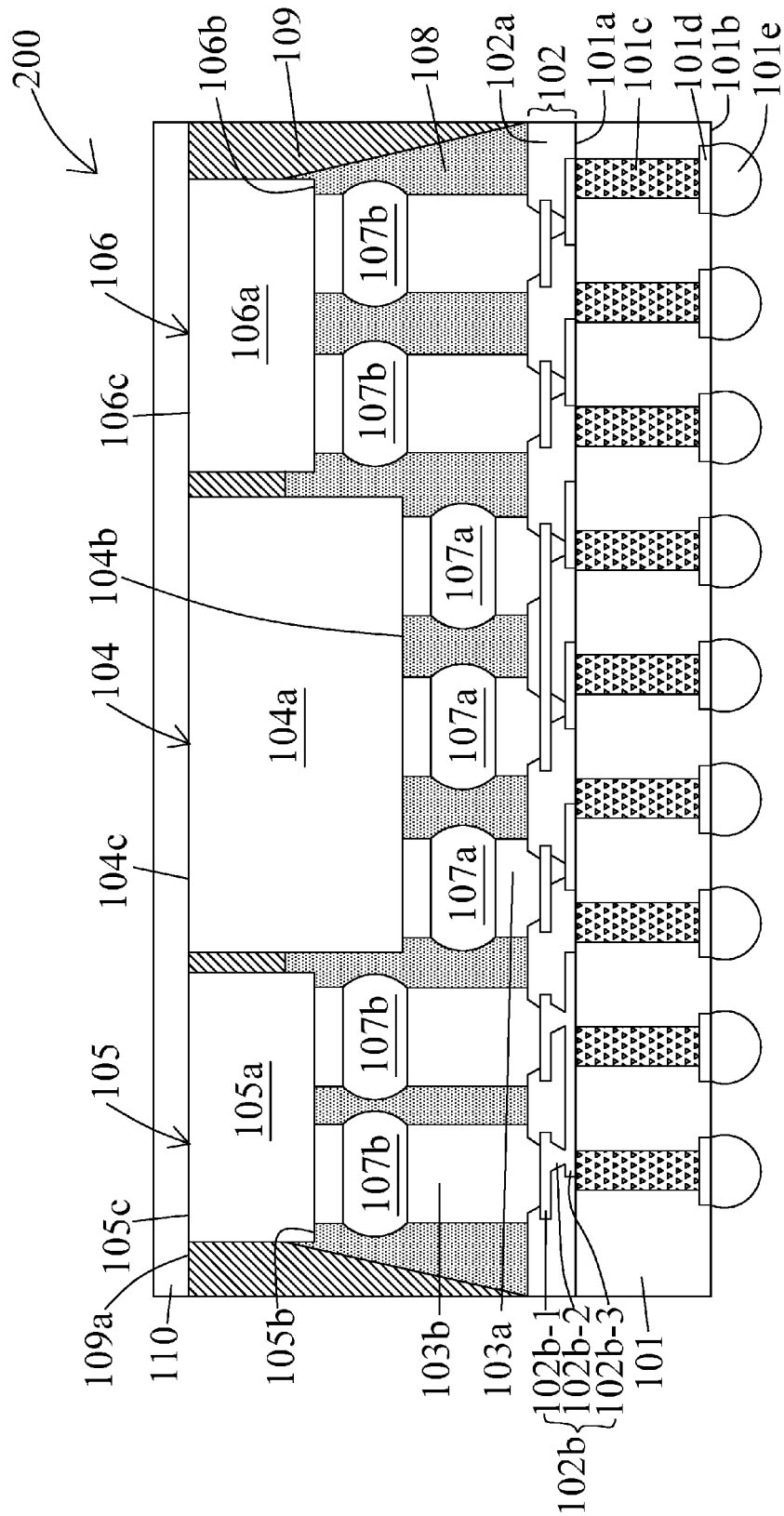

In some embodiments as shown in FIG. 5M, a heat dissipation means 110 is disposed over the first die 104 and the second die (105 or 106). In some embodiments, a connector 101e is disposed over the bond pad 101d of the substrate 101. In some embodiments, the connector 101e is formed by ball dropping, solder pasting or any other suitable operations. In some embodiments, the heat dissipation means 110 and the connector 101e have similar configuration as described above or illustrated in FIG. 3 or 4. In some embodiments, a semiconductor structure 200 is formed as illustrated in FIG. 3.

Figure 5N:
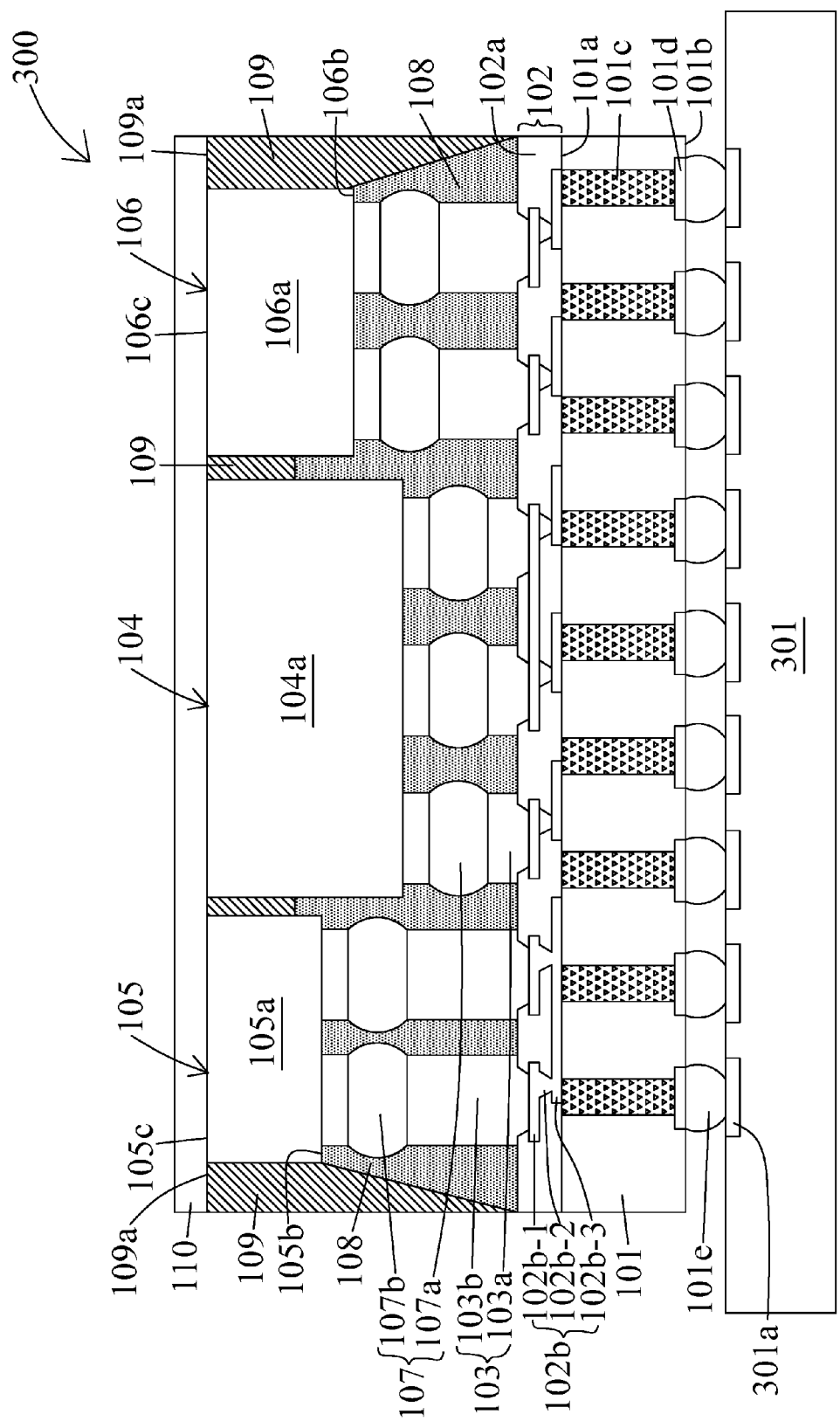

In some embodiments as shown in FIG. 5N, a board 301 including a pad 301a is provided or received. In some embodiments, the connector 101e is bonded with the pad 301a. In some embodiments, the board 301 and the pad 301a have similar configuration as described above or illustrated in FIG. 4. In some embodiments, a semiconductor structure 400 is formed as illustrated in FIG. 4.

A semiconductor structure is disclosed. The semiconductor structure includes dies in various thicknesses and conductive pillars in various heights correspondingly. As such, the thickness difference between the dies would be compensated by the conductive pillars in different heights, and the backsides of the dies would be disposed at a level same as each other. Since no molding is present over the backsides of the dies, the warpage of the semiconductor structure after thermal operations would be prevented or minimized, and cold joint would be avoided.

In some embodiments, a semiconductor structure includes a substrate, a redistribution layer (RDL) including a dielectric layer disposed over the substrate and a plurality of conductive members surrounded by the dielectric layer, a first conductive pillar disposed over and electrically connected with one of the plurality of conductive members, a second conductive pillar disposed over and electrically connected with one of the plurality of conductive member, a first die disposed over the RDL and electrically connected with the first conductive pillar, and a second die disposed over the RDL and electrically connected with the second conductive pillar, wherein a height of the second conductive pillar is substantially greater than a height of the first conductive pillar, and a thickness of the first die is substantially greater than a thickness of the second die.

In some embodiments, a distance between the second die and the RDL is substantially greater than a distance between the first die and the RDL. In some embodiments, a total height of the first conductive pillar and the first die is substantially same as a total height of the second conductive pillar and the second die. In some embodiments, the second conductive pillar or the second die is disposed adjacent to an edge of the semiconductor structure. In some embodiments, the first conductive pillar or the second conductive pillar is protruded from the RDL and away from the substrate. In some embodiments, a dimension of the first die is substantially greater than a dimension of the second die. In some embodiments, a conductive bump is disposed between the first die and the first conductive pillar or between the second die and the second conductive pillar. In some embodiments, each of the plurality of conductive members includes a portion exposed from the dielectric layer and configured to receive the first conductive pillar or the second conductive pillar. In some embodiments, a soldering material is disposed between the first conductive pillar and the first conductive bump or between the second conductive pillar and the second conductive bump.

In some embodiments, a semiconductor structure includes a substrate, a redistribution layer (RDL) including a dielectric layer disposed over the substrate and a plurality of conductive members surrounded by the dielectric layer, a plurality of conductive pillars disposed over and electrically connected with the plurality of conductive members respectively, a first die disposed over the substrate, including a first side facing the RDL and a second side opposite to the first side, and electrically connected with at least one of the plurality of conductive pillars, a second die disposed over the substrate, including a third side facing the RDL and a fourth side opposite to the third side, and electrically connected with at least one of the plurality of conductive pillars, wherein a thickness of the first die is substantially different from a thickness of the second die, and the second side of the first die and the fourth side of the second die are at substantially same level.

In some embodiments, the first side of the first die is at a level substantially different from a level of the third side of the second die. In some embodiments, the second side of the first die is horizontally aligned with the fourth side of the second die. In some embodiments, the semiconductor structure further includes a molding surrounding the first die and the second die. In some embodiments, the second side of the first die and the fourth side of the second die are exposed from the molding. In some embodiments, a top surface of the molding is at a level substantially same as a level of the second side of the first die or a level of the fourth side of the second die. In some embodiments, a portion of the molding is disposed between the first die and the second die. In some embodiments, the semiconductor structure further includes an underfill material disposed between the substrate and the first die or between the substrate and the second die, and encapsulating the plurality of conductive pillars, or a heat dissipation means contacting with the second side of the first die and the fourth side of the second die.

In some embodiments, a method of manufacturing a semiconductor structure includes providing a substrate including a redistribution layer (RDL) disposed over the substrate, disposing a first patterned mask over the RDL, disposing a first conductive material over the RDL exposed from the first patterned mask to form a first conductive pillar, removing the first patterned mask, disposing a second patterned mask over the RDL, disposing a second conductive material over the RDL exposed from the second patterned mask to form a second conductive pillar, removing the second patterned mask, disposing a first die over the first conductive pillar, and disposing a second die over the second conductive pillar, wherein a height of the second conductive pillar is substantially greater than a height of the first conductive pillar.

In some embodiments, a thickness of the second patterned mask is substantially greater than a thickness of the first patterned mask. In some embodiments, the disposing the first conductive material or the disposing the second conductive material includes electroplating operations. In some embodiments, the method further includes disposing a seed layer between the RDL and the first patterned mask or between the RDL and the second patterned mask, disposing a soldering material over the first conductive pillar or the second conductive pillar, bonding the first die with the first conductive pillar by a first conductive bump, bonding the second die with the second conductive pillar by a second conductive bump, disposing an underfill material to encapsulate the first conductive pillar and the second conductive pillar, disposing a molding to surround the underfill material, the first die and the second die, or disposing a heat dissipation means over the first die and the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate;
a redistribution layer (RDL) including a dielectric layer disposed over the substrate and a plurality of conductive members surrounded by the dielectric layer;
a first conductive pillar disposed over and electrically connected with one of the plurality of conductive members;
a second conductive pillar disposed over and electrically connected with one of the plurality of conductive member;
a first die disposed over the RDL and electrically connected with the first conductive pillar; and
a second die disposed over the RDL and electrically connected with the second conductive pillar,
wherein a height of the second conductive pillar is substantially greater than a height of the first conductive pillar, and a thickness of the first die is substantially greater than a thickness of the second die, a total height of the first conductive pillar and the first die is substantially same as a total height of the second conductive pillar and the second die.

2. The semiconductor structure of claim 1, wherein a distance between the second die and the RDL is substantially greater than a distance between the first die and the RDL.

3. The semiconductor structure of claim 1, wherein the first die is disposed adjacent to the second die.

4. The semiconductor structure of claim 1, wherein the second conductive pillar or the second die is disposed adjacent to an edge of the semiconductor structure.

5. The semiconductor structure of claim 1, wherein the first conductive pillar or the second conductive pillar is protruded from the RDL and away from the substrate.

6. The semiconductor structure of claim 1, wherein a conductive bump is disposed between the first die and the first conductive pillar or between the second die and the second conductive pillar.

7. The semiconductor structure of claim 1, wherein each of the plurality of conductive members includes a portion exposed from the dielectric layer and configured to receive the first conductive pillar or the second conductive pillar.

8. The semiconductor structure of claim 1, wherein a soldering material is disposed between the first conductive pillar and the first conductive bump or between the second conductive pillar and the second conductive bump.

9. The semiconductor structure of claim 1, wherein a ratio of the height of the first conductive pillar to a height of the second conducive pillar is substantially greater than about 1:1.5.

10. A semiconductor structure, comprising:
a substrate;
a redistribution layer (RDL) including a dielectric layer disposed over the substrate and a plurality of conductive members surrounded by the dielectric layer;
a plurality of conductive pillars disposed over and electrically connected with the plurality of conductive members respectively;
a first die disposed over the substrate, including a first side facing the RDL and a second side opposite to the first side, and electrically connected with at least one of the plurality of conductive pillars;
a second die disposed over the substrate, including a third side facing the RDL and a fourth side opposite to the third side, and electrically connected with at least one of the plurality of conductive pillars,
wherein a thickness of the first die is substantially different from a thickness of the second die, and the second side of the first die and the fourth side of the second die are at substantially same level.

11. The semiconductor structure of claim 10, wherein the first side of the first die is at a level substantially different from a level of the third side of the second die.

12. The semiconductor structure of claim 10, wherein the second side of the first die is horizontally aligned with the fourth side of the second die.

13. The semiconductor structure of claim 10, further comprising a molding surrounding the first die and the second die.

14. The semiconductor structure of claim 13, wherein the second side of the first die and the fourth side of the second die are exposed from the molding.

15. The semiconductor structure of claim 13, wherein a top surface of the molding is at a level substantially same as a level of the second side of the first die or a level of the fourth side of the second die.

16. The semiconductor structure of claim 12, wherein a portion of the molding is disposed between the first die and the second die.

17. The semiconductor structure of claim 10, further comprising:
an underfill material disposed between the substrate and the first die or between the substrate and the second die, and encapsulating the plurality of conductive pillars; or
a heat dissipation means contacting with the second side of the first die and the fourth side of the second die.

18. A semiconductor structure, comprising:
a substrate;
a plurality of vias extended through the substrate;
a redistribution layer (RDL) including a dielectric layer disposed over the substrate and a plurality of conductive members surrounded by the dielectric layer and disposed over the plurality of vias;
a plurality of conductive pillars disposed over the plurality of conductive members respectively;
a first die disposed over the RDL and electrically connected with at least one of the plurality of conductive members; and
a second die disposed over the RDL and electrically connected with at least one of the plurality of conductive members,
wherein the first die includes a first surface and a second surface opposite to the first surface, the second die includes a third surface and a fourth surface opposite to the third surface, the plurality of conductive pillars are disposed between the first surface and the dielectric layer or between the third surface and the dielectric layer, a distance between the first surface and the dielectric layer is substantially less than a distance between the third surface and the dielectric layer, a distance between the second surface and the dielectric layer is substantially same as a distance between the fourth surface and the dielectric layer.

19. The semiconductor structure of claim 18, wherein the plurality of vias are electrically connected to the plurality of conductive members.

20. The semiconductor structure of claim 18, further comprising a plurality of connectors disposed over the plurality of vias respectively.

* * * * *